United States Patent [19]

Sin

[11] Patent Number: 5,227,653
[45] Date of Patent: Jul. 13, 1993

[54] LATERAL TRENCH-GATE BIPOLAR TRANSISTORS

[75] Inventor: Johnny K. O. Sin, Wan Chai, Hong Kong

[73] Assignee: North American Philips Corp., New York, N.Y.

[21] Appl. No.: 741,288

[22] Filed: Aug. 7, 1991

[51] Int. Cl.$^5$ .................. H01L 29/00; H01L 29/10; H01L 29/74
[52] U.S. Cl. ................... 257/334; 257/328; 257/265; 257/287
[58] Field of Search ............ 357/23.4, 23.8, 38, 357/37; 257/334, 265, 328

[56] References Cited

U.S. PATENT DOCUMENTS

| | | | |
|---|---|---|---|
| 4,199,774 | 4/1980 | Plummer | 357/38 |
| 4,546,367 | 10/1985 | Schutten et al. | 357/23.4 |
| 4,914,058 | 4/1990 | Blanchard | 357/23.4 |
| 4,951,102 | 8/1990 | Beitman et al. | 357/23.4 |
| 4,959,703 | 9/1990 | Ogura et al. | 357/23.4 |
| 4,963,951 | 10/1990 | Adler et al. | 357/23.7 |
| 5,016,067 | 5/1991 | Mori | 357/330 |
| 5,049,968 | 9/1991 | Nakagawa et al. | 357/43 |
| 5,072,287 | 12/1991 | Nakagawa et al. | 357/43 |

FOREIGN PATENT DOCUMENTS 0111803 12/1983 European Pat. Off. .
0372391 11/1989 European Pat. Off. .
3820677 6/1988 Fed. Rep. of Germany .
121908 1/1989 Japan ...................... 357/23.4

*Primary Examiner*—Rolf Hille
*Assistant Examiner*—Mahshid Saadat
*Attorney, Agent, or Firm*—Steven R. Biren

[57] ABSTRACT

A lateral trench-gate bipolar transistor device includes spaced-apart, surface-adjoining, laterally-oriented anode and cathode regions. A channel region at least partially surrounds the cathode region, and a gate region is provided adjacent to, but insulated from, the cathode region and the channel region. The gate region extends in a substantially vertical direction adjacent the cathode region and the channel region in order to induce a substantially vertical conduction channel in the channel region of the lateral device during operation. The gate region can advantageously be provided in a trench surrounding the transistor device, with a trench-shaped gate dielectric layer being provided on the trench sidewalls and floor to insulate the gate from the remainder of the device. Devices may be fabricated in an epitaxial surface layer, which may be provided either directly on a semiconductor substrate, or else on an intervening insulating layer. These devices provide the advantages of low on-resistance, fast switching speed, high breakdown voltage and high latch up current density.

9 Claims, 1 Drawing Sheet

LATERAL TRENCH-GATE BIPOLAR TRANSISTORS

BACKGROUND OF THE INVENTION

The invention is in the field of metal-oxide-semiconductor (MOS) field-effect devices, and relates more specifically to lateral trench-gate bipolar transistor (LTGBT) devices suitable for power integrated circuit applications.

In the field of power integrated circuits, device designers seek to achieve devices with low on-resistance, fast switching times and high breakdown voltage. One category of devices which has exhibited considerable promise in these areas is the insulated-gate bipolar transistor (IGBT), a class of devices which incorporates the insulated-gate structure of a conventional majority-carrier MOS device, and additionally uses minority carrier conduction for conductivity modulation. Representative prior-art IGBT devices are shown in EP 0 111 803, EP 0 372 391 and DE 3820677. Examples of other types of structures, using various trench configurations, are shown in U.S. Pat. No. 4,546,367 and EP 0 047 392.

Although minority-carrier IGBT devices have received considerable attention because of their favorable performance characteristics when used in high-power applications, these devices have heretofore suffered from an important drawback. In particular, conductivity-modulated power devices tend to "latch up" at high current densities, a problem which is exacerbated when high voltages are also present. Since high-current and/or high voltage conditions are always encountered in power devices, a way is needed to provide conductivity-modulated power devices with high resistance to latch up. Absent such an improvement, these devices will tend to "latch up" in a manner similar to that exhibited by thyristors, such that they will be unable to be turned "off". This may result in temporary, or even permanent, damage to the devices.

A prior-art solution to this problem has been to increase the doping of the channel region in IGBT devices. This lowers the channel resistance, and therefore the voltage drop across the channel during conduction, resulting in a more latch-up resistant device. However, a major drawback of this technique is that the threshold voltage of the device is thereby increased, typically to a level where it is difficult to provide a sufficient gate turn-on voltage. Furthermore, this expedient only reduces, but does not eliminate, the problem.

Accordingly, a substantial need exists for a device which will incorporate the inherent advantages of conventional IGBT devices, while at the same time affording substantially improved resistance to latch up.

SUMMARY OF THE INVENTION

It is therefore an object of the present invention to provide an IGBT device having low on-resistance, fast switching characteristics, and high breakdown voltage, while at the same time offering substantially improved resistance to latch-up in high-power and/or high-voltage circuit applications.

It is a further object of the invention to provide an IGBT device with the aforementioned advantages which is also simple and compact in construction, and capable of being fabricated in SOI technology.

In accordance with the invention, these objects are achieved by a new configuration of IGBT device hereinafter referred to as a "Lateral Trench-Gate Bipolar Transistor" (LTGBT) device. The LTGBT is a gated bipolar transistor having spaced-apart, surface-adjoining, laterally-oriented anode and cathode regions, with a channel region at least partially surrounding the cathode region. A gate region is provided adjacent to, but insulated from, the cathode region and the channel region. The gate region extends in a substantially vertical direction adjacent the cathode region and the channel region, so as to induce a substantially vertical conduction channel in the channel region of the lateral device during operation. In a first embodiment of the invention, the LTGBT device is formed in an epitaxial surface layer provided on a semiconductor substrate. In a second embodiment, a buried insulating layer is provided on the substrate, with the epitaxial surface layer being provided on the buried insulating layer, so as to completely insulate the device from the substrate.

In essence, these configurations result in lateral device structures, with both the anode and cathode regions being adjacent to the same surface, while at the same time providing a vertical conduction channel controlled by an insulated gate region extending within a trench in a substantially vertical direction adjacent the channel region.

This unique configuration provides a lateral surface-adjoining path from anode to cathode for holes, and a second path which extends from the cathode, down for a short distance through the vertical conduction channel and then across in a lateral direction to the anode. Since minority carriers (holes) can flow to the cathode directly, in the lateral direction, without first flowing through the vertical conduction channel, forward bias of the cathode-channel junction is minimized. This will prevent turn-on of the parasitic npn transistor inherent in the structure, and thereby prevent latch-up, even at high current densities. Furthermore, since electron flow is initially in a downward direction, electron-hole recombination currents can now flow in the body of the device, rather than at the surface as in the case of prior-art lateral insulated gate bipolar transistors. Another advantage of the proposed structures is that, since the gate-controlled channel conducting region is substantially vertical, the dimensions of this region can be optimized, while at the same time the lateral dimension of the channel region can be increased in order to provide field shaping, which results in improved high-voltage breakdown characteristics.

Additionally, since the LTGBT device can be formed on a buried insulating layer, the entire device can be easily and effectively insulated, thus making it particularly suitable for applications, such as source-follower "high side" switches, which require high-voltage insulation of the entire device.

Figure 1:
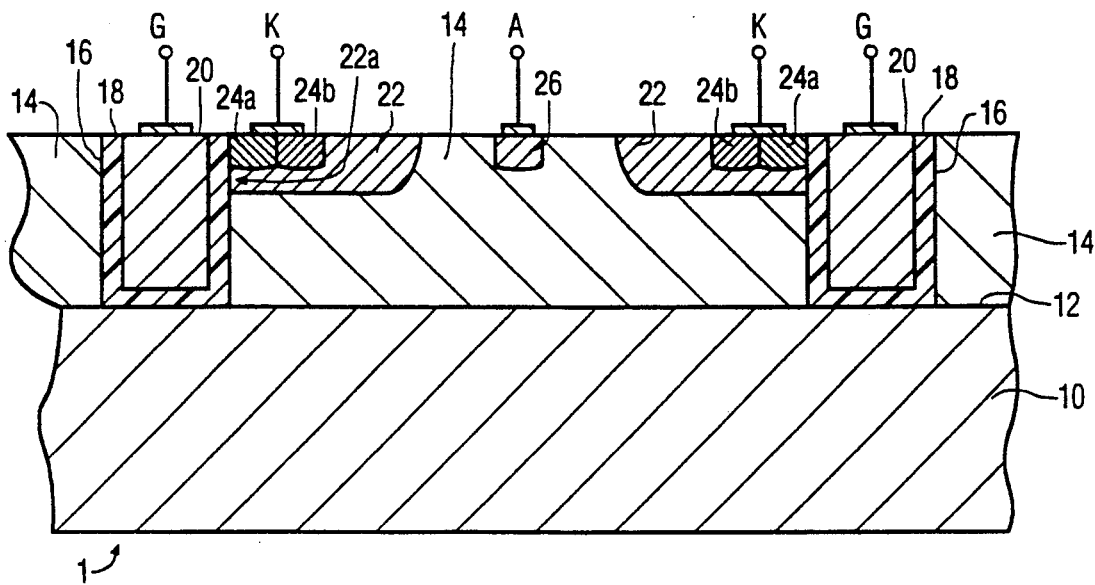
FIG. 1 is a cross-sectional view of a lateral trench-gate bipolar transistor (LTGBT) device in accordance with a first embodiment of the invention.

It should be noted that the figures are not drawn to scale, and in particular that the vertical dimensions are exaggerated for improved clarity. Additionally, semiconductor regions of the same conductivity type are generally shown hatched in the same direction, and corresponding regions in different figures are generally designated by the same reference numerals.

DESCRIPTION OF THE PREFERRED EMBODIMENTS

FIG. 1 of the drawing shows a lateral trench-gate bipolar transistor (LTGBT) device in accordance with a first embodiment of the invention. In FIG. 1, LTGBT device 1 has a semiconductor substrate 10 of a first conductivity type, here p-type. The substrate is relatively lightly doped, with a typical doping concentration of about $10^{14}$ atoms/cm$^3$. An epitaxial surface layer 14 of a second conductivity type opposite to that of the first, here n-type, is provided on a first major surface 12 of the substrate, and forms a p-n junction therewith. The epitaxial layer 14 may typically have a thickness of about 2.5 microns and a charge per unit area of between 1 and $2 \times 10^{12}$ atoms/cm$^2$. A trench 16 is provided in the epitaxial surface layer 14 and extends entirely through the epitaxial layer. This trench, which may be formed by a conventional technique such as etching, can typically be about 2 microns wide and surrounds the active portion of the device.

A trench-shaped gate dielectric layer 18, which may typically be a silicon oxide film of about 0.05 microns thickness, covers the sidewalls and floor of the trench. The dielectric-covered trench contains a gate region 20 which is formed of a material such as polysilicon, and which can be fabricated by a standard process such as poly refill. A gate electrode G is provided to make electrical contact to the gate region 20.

A surface-adjoining channel region 22 of p-type conductivity is provided in the epitaxial layer 14 adjoining the inner side wall of trench 16. The channel region 22 extends vertically through a portion of the epitaxial surface layer and extends laterally inward from the inner side wall of the trench towards a central portion of the LTGBT device. Although the configuration of this channel region may vary greatly as a function of device design requirements, this region may typically be about 1.5 microns thick and have a doping concentration of about $10^{17}$ atoms/cm$^3$ and a length of about 20 to 25 microns in the lateral direction.

The LTGBT device of FIG. 1 further includes a surface-adjoining cathode region having a highly-doped n-type surface-adjoining zone 24a adjacent the inner sidewall of trench 16 and extending downwardly thorugh a portion of the channel region 22. In this embodiment, the cathode region further includes a second highly-doped surface-adjoining zone 24b of p-type conductivity which is provided adjacent to zone 24a and serves to enhance the connection to the channel region 22. Zones 24a and 24b of the cathode region may both typically be about 0.5 microns thick and have a relatively high doping concentration of about $10^{20}$ atoms/cm$^3$. The width of zones 24a and 24b may typically be about 5 microns each, with an electrical connection to the cathode region being provided by cathode electrode K, which contacts both zone 24a and zone 24b.

The LTGBT device construction is completed by a surface-adjoining anode region 26, which forms a p-n junction with the epitaxial layer 14. Anode region 26 is located in the central portion of the epitaxial layer, and is spaced apart from the channel region 22. An anode electrode A provides an electrical connection to the anode region 26. In the embodiment shown in FIG. 1, the surface-adjoining anode region includes a highly-doped p-type surface-adjoining region 26, which may typically have a thickness of about 0.5 microns and a doping concentration of about $10^{20}$ atoms/cm$^3$, although alternative configurations are expressly within the scope of the invention. Thus, for example, the anode region may be provided as a segmented p+/n+ anode, a segmented p+/Schottky anode or as a pure Schottky diode in order to enhance switching speed. These alternative anode structures are known in the prior art, and are described in U.S. patent application Ser. No. 576,131, entitled SEGMENTED-ANODE LATERAL INSULATED-GATE BIPOLAR TRANSISTOR DEVICES, by MUKHERJEE et al, incorporated herein by reference. Accordingly, these features are not shown or further described herein in the interest of brevity.

The unique configuration of the channel region 22, which provides a substantially vertical conduction channel 22a between the cathode region and the underlying portion of the epitaxial layer even though the channel region as a whole is laterally oriented, permits the simultaneous optimization of several parameters which in conventional devices must be selected in a manner that results in a trade-off. Thus, for example, the substantially vertical conduction channel 22a can be kept desirably short, while the channel region itself can be extended inwardly toward the anode region in order to improve high-voltage breakdown characteristics. In a particularly advantageous configuration, the channel region 22 extends laterally inwardly beyond cathode region zone 24b for a distance which is about ½ of the distance between cathode region zone 24b and anode region 26.

Figure 2:
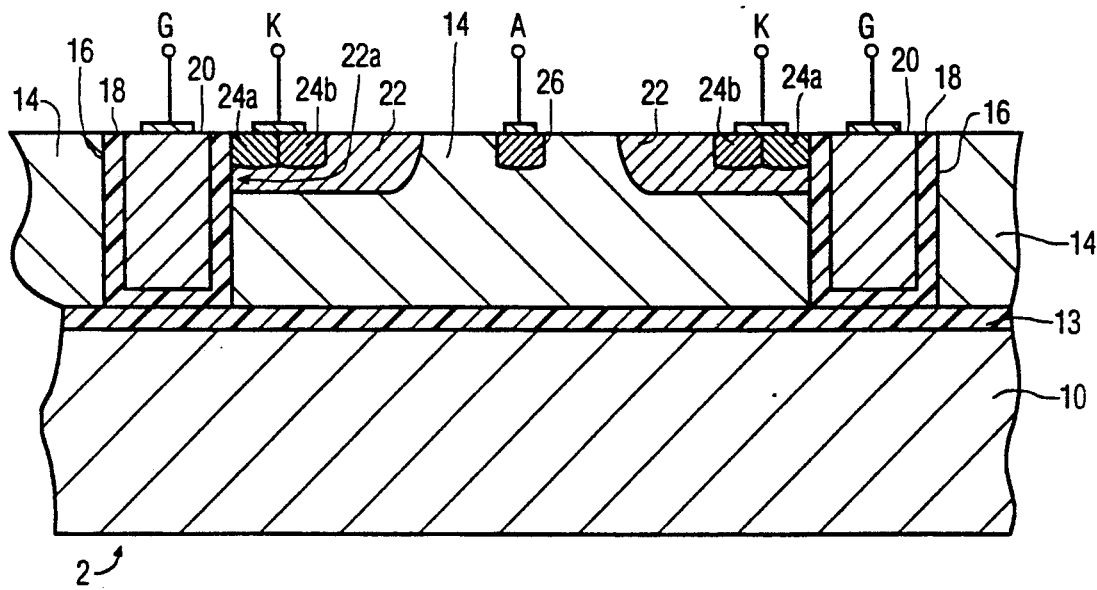
FIG. 2 is a cross-sectional view of an LTGBT device fabricated on an insulating layer in accordance with a second embodiment of the invention.

A second embodiment of an LTGBT device in accordance with the invention is shown in FIG. 2. This embodiment is generally similar to the configuration shown in FIG. 1, but with one important difference. Rather than having the substrate 10 and epitaxial layer 14 meet at a p-n junction at surface 12 to provide junction isolation for the device, the epitaxial surface layer and substrate may be isolated from each other by a buried insulating layer 13 provided on the substrate 10, with the epitaxial surface layer 14 being provided on the buried insulating layer. buried insulating layer 13 may typically be a layer of about 0.5 microns of thermal silicon oxide, formed in a conventional manner. Thus, a silicon-on-insulator (SOI) LTGBT device is formed, with the device being completely oxide-insulated from all surrounding semiconductor regions. Accordingly, the structure shown in FIG. 2 is particularly suitable for high-voltage applications such as source-follower high-side switches. where the entire device must be effectively insulated to withstand high voltages without danger of breakdown.

In summary, devices.in accordance with the present invention are capable of providing all of the advantages associated with prior-art LIGBT devices, while at the same time overcoming the most significant drawback of the prior structures, namely their susceptibility to potentially damaging latch-up at high current and/or high voltage levels. Furthermore, the devices disclosed herein are particularly adaptable to SOI technology, thus permitting a wide range of high-voltage circuit applications.

While the invention has been particularly shown and described with reference to several preferred embodiments thereof, it will be understood by those skilled in the art that various changes in form and detail may be made without departing from the spirit and scope of the invention.

I claim:

1. A lateral trench-gate bipolar transistor device, which comprises:
   a semiconductor substrate of a first conductivity type;
   an epitaxial surface layer of a second conductivity type opposite that of the first provided over said substrate;
   a trench extending through said epitaxial surface layer and surrounding said transistor device;
   a trench-shaped gate dielectric layer covering the sidewalls and floor of said trench;
   a gate region within said trench-shaped dielectric layer and comprising polysilicon;
   a surface-adjoining channel region of said first conductivity type adjoining the inner sidewall of said trench, extending vertically through a portion of said epitaxial surface layer and extending laterally inward from said inner sidewall towards a central portion of said transistor device;
   a surface-adjoining cathode region having at least a highly-doped surface-adjoining zone of said second conductivity type adjacent the inner sidewall of said trench and extending downwardly through a portion of said channel region; and
   a surface-adjoining anode region forming a rectifying junction with said epitaxial layer, located in the central portion of said epitaxial layer and spaced apart from said channel region.

2. A lateral trench-gate bipolar transistor device as in claim 1, wherein said surface-adjoining cathode region further comprises a highly-doped surface-adjoining zone of said first conductivity type adjoining the highly-doped surface-adjoining zone of said second conductivity type, spaced apart from the inner sidewall of said trench by the surface-adjoining zone of said second conductivity type, and extending downwardly through a portion of said channel region.

3. A lateral trench-gate bipolar transistor device as in claim 1, wherein said trench extends substantially entirely through said epitaxial surface layer in a direction substantially orthogonal to said major surface.

4. A lateral trench-gate bipolar transistor device as in claim 1, wherein said epitaxial layer is provided directly on said substrate.

5. A lateral trench-gate bipolar transistor device as in claim 1, further comprising a buried insulating layer on said substrate, said epitaxial surface layer being provided on said buried insulating layer.

6. A lateral trench-gate bipolar transistor device as in claim 1, wherein said surface-adjoining channel region extends laterally inward beyond said cathode region for a distance which is about one-half a distance between said cathode region and said anode region.

7. A lateral trench-gate bipolar transistor device as in claim 1, wherein said surface-adjoining anode region comprises a highly-doped zone of said first conductivity type located in the central portion of said epitaxial layer and spaced apart from said channel region.

8. A lateral trench-gate bipolar transistor device as in claim 1, wherein said surface-adjoining anode region comprises a Schottky diode.

9. A lateral trench-gate bipolar transistor device as in claim 1, wherein said epitaxial surface layer is provided on an insulating layer.

* * * * *